US006833602B1

(12) United States Patent
Mehta

(10) Patent No.: US 6,833,602 B1
(45) Date of Patent: Dec. 21, 2004

(54) DEVICE HAVING ELECTRICALLY ISOLATED LOW VOLTAGE AND HIGH VOLTAGE REGIONS AND PROCESS FOR FABRICATING THE DEVICE

(75) Inventor: Sunil D. Mehta, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/236,114

(22) Filed: Sep. 6, 2002

(51) Int. Cl.[7] .......................... H01L 29/00; H01L 21/76

(52) U.S. Cl. ....................... 257/501; 257/506; 257/510; 257/513; 438/427; 438/437; 438/424; 438/221; 438/296

(58) Field of Search ................................ 438/257, 275, 438/427, 437; 257/501, 510, 506, 502, 513

(56) References Cited

U.S. PATENT DOCUMENTS 5,679,599 A 10/1997 Mehta
5,854,114 A 12/1998 Li et al.
6,064,105 A 5/2000 Li et al.
6,171,930 B1 * 1/2001 Lee et al. .................. 438/432
6,221,733 B1 4/2001 Li et al.
6,245,638 B1 * 6/2001 Gardner et al. ............. 438/424
6,383,877 B1 * 5/2002 Ahn et al. .................. 438/296
2002/0024111 A1 * 2/2002 Shin ........................... 257/500
2002/0033516 A1 * 3/2002 Choi et al. .................. 257/510
2002/0130382 A9 * 9/2002 Shimizu et al. ............. 257/501

FOREIGN PATENT DOCUMENTS

JP 62-088334 * 4/1987
JP 2001-168184 * 6/2001

OTHER PUBLICATIONS

Wolf, "Silicon processing For The VLSI Era"; Vol. 3: The Submicron MOSFET; Lattice Press; 1995; pp 371–373.*

* cited by examiner

*Primary Examiner*—Hsien-Ming Lee
(74) *Attorney, Agent, or Firm*—Brinks Hofer Gilson & Lione

(57) ABSTRACT

A device having electrically isolated low voltage and high voltage substrate regions includes low voltage and high voltage trench isolation structures in which a deep portion of the high voltage isolation trench provides electrical isolation in the high voltage regions. The high voltage isolation trench structures include a shallow portion that is simultaneously formed with the low voltage trench isolation structures. The deep portion of the high voltage isolation trench has a bottom surface and shares a continuous wall surface with the shallow portion that extends from the bottom surface to the principal surface of the substrate. A process for fabricating the device includes the use of a single resist pattern to simultaneously form the low voltage isolation trench structures and the shallow portion of the high voltage isolation structures.

19 Claims, 5 Drawing Sheets

DEVICE HAVING ELECTRICALLY ISOLATED LOW VOLTAGE AND HIGH VOLTAGE REGIONS AND PROCESS FOR FABRICATING THE DEVICE

TECHNICAL FIELD

The present invention relates, in general, to semiconductor devices having low voltage and high voltage transistors and to processes for device fabrication and, more particularly, to electrical isolation for electrically-erasable-programmable-read-only-memory (EEPROM) devices and to process for fabricating electrical isolation structures.

BACKGROUND

Non-volatile memory devices are both electrically erasable and programmable. Such devices retain data even after the power to the device is terminated. One particular type of non-volatile memory device is the (electrically-erasable-programmable-read-only-memory) EEPROM device. In an EEPROM device, programming and erasing is accomplished by transferring electrons to and from a floating-gate electrode through a thin dielectric layer, known as a tunnel-oxide layer, located between the floating-gate electrode and the underlying substrate.

To program EEPROMs with a programmable logic device (PLD), a high voltage Vpp+ is applied to the gate electrode of the write transistor and a relatively lower voltage Vpp is applied to the drain (bit line contact) of the write transistor. The voltage applied to the write transistor gate electrode turns the write transistor on allowing the voltage applied to the bit line to be transferred to the source of the write transistor. The application of such high voltage levels is a write condition that results in a net positive charge being stored in the EEPROM cell.

To erase the EEPROM cell, a voltage Vcc is applied to the gate of the write transistor and ground potential is applied to the bit line and a high voltage Vpp+ is applied to the programming region. Under this bias condition, the high voltage applied to programming region is coupled to the floating-gate electrode and the EEPROM cell is erased by the transfer of electrons from the substrate to the floating-gate electrode.

The voltages required for programming and erasing of the EEPROM cell require charge pumping circuitry to generate the high voltages. In addition to charge pumping circuitry, other high voltage circuit elements include cell transistors, such as program transistors and sense transistors. An EEPROM cell includes low voltage circuitry, such as read transistors and logic transistor. As in other types of devices, electrical isolation is necessary to electrically isolate various transistors in the device. In particular, it is necessary to electrically isolate the high voltage elements from the low voltage elements. Typically, low voltage devices require less robust isolation than high voltage devices.

To conserve valuable substrate area, the electrical isolation structure is fabricated by first forming a trench formed in the substrate. The trench is then filled with an electrically insulating material, such as silicon dioxide. The trench isolation runs between selected regions of the substrate containing, for example, the charge pumping circuitry and the EEPROM cells. The trench isolation also electrically separates active areas within the EEPROM cells. To adequately electrically isolate the high voltage devices, the trench needs to have a depth that is sufficient to contain a large amount of silicon dioxide. Conversely, only a relatively shallow trench is necessary to electrically isolate the low voltage devices. Simply making all of the isolation sufficient for the high voltage devices, however, consumes more substrate area than necessary. More compact, high-density device structures could be fabricated if an efficient method existed for fabricating trench isolation regions that were not excessively deep for isolation of low voltage device elements.

SUMMARY

The present invention relates to a process fabricating a semiconductor device having high voltage device elements and low voltage device elements. Although the invention is particularly suited to the fabrication of EEPROM devices, the electrical isolation structure and fabrication process of the invention can be used for any semiconductor device that includes high voltage and low voltage device elements.

In one aspect, a process for fabricating a semiconductor device includes providing a substrate having a principal surface and having a low voltage region and a high voltage region. A shallow portion of a low voltage isolation trench in the low voltage region and a shallow portion of a high voltage isolation trench in the high voltage region are simultaneously formed. Then, a deep portion of the high voltage isolation trench in the high voltage region is formed.

The deep portion provides electrical isolation between the high voltage region and the low voltage region. The shallow portion provides electrical isolation between adjacent portions of the low voltage region.

In another aspect of the invention, a process for fabricating isolation trenches in a substrate of a semiconductor device includes, for each of a plurality of isolation trenches, forming in the same process step, a shallow portion of sufficient depth to isolate a low voltage region, but not of sufficient depth to isolate a high voltage region. For an isolation trench that is to isolate a high voltage region, forming within the shallow portion, a deep portion of sufficient depth to isolate a high voltage region.

In another aspect a semiconductor device is provided that includes a substrate having a principal surface. The substrate also includes a low voltage region and a high voltage region. A trench having a deep portion and a shallow portion resides in the high voltage region, wherein the deep portion provides electrical isolation between the high voltage region and the low voltage region, and a trench resides in the low voltage region, wherein the shallow region provides electrical isolation between adjacent portions of the low voltage region.

Figure 1:
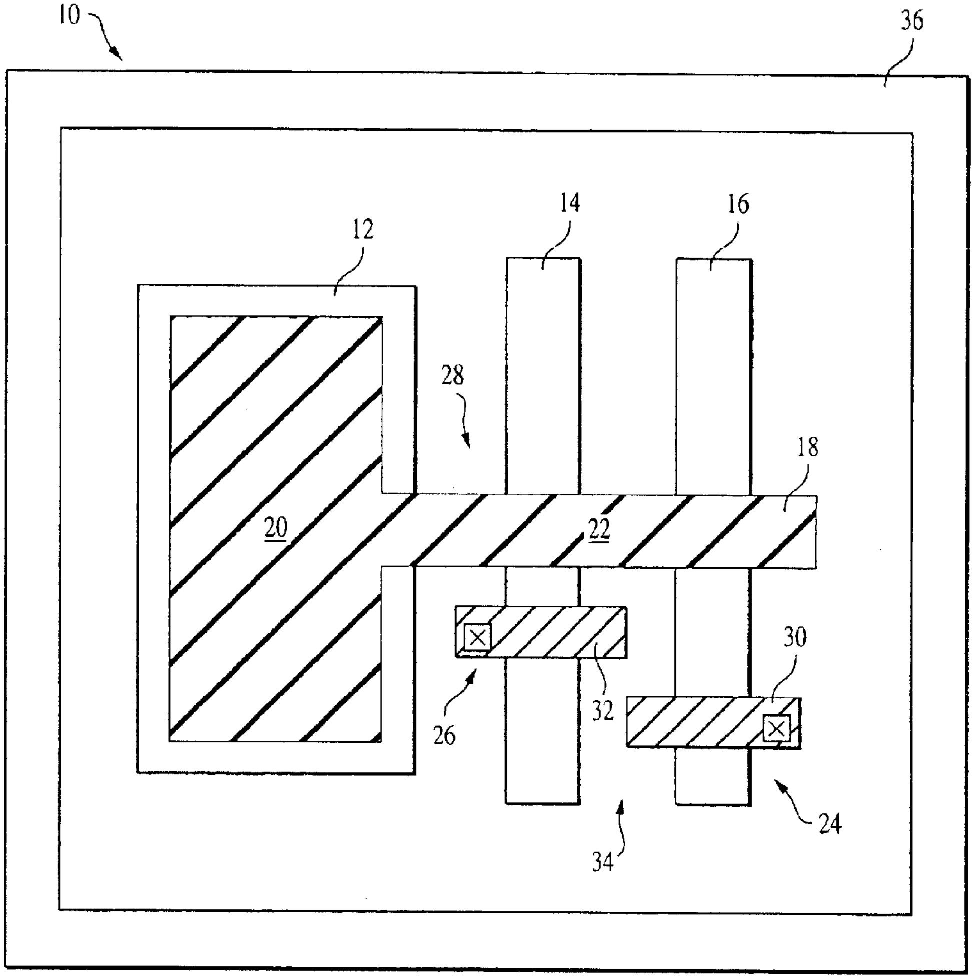
FIG. 1 illustrates a top view of an EEPROM memory cell arranged in accordance with one embodiment of the invention.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

A top view of an EEPROM device 10 arranged and in accordance with one embodiment of the invention is illustrated in FIG. 1. EEPROM device 10 includes three active substrate regions, a programming region 12, a sensing region 14, and a tunnel region 16. A floating-gate electrode 18 includes a capacitor portion 20 overlying programming region 12 and a gate portion 22 overlying sensing region 14 and a tunnel region 16. Device 10 also includes a write transistor 24, a read transistor 26, and a sense transistor 28. Write transistor 24 is formed where a gate electrode 30 overlies tunnel region 16. Read transistor 26 is formed where a gate electrode 32 overlies sensing region 14 and sense transistor 28 is formed where gate portion 22 overlies sensing region 14. Electrons are transferred to and from floating-gate electrode 18 where gate portion 22 overlies tunnel region 16.

In the operation of EEPROM device 10, high voltages, such as about 10 volts to about 12 volts are applied to floating-gate electrode 18 and to programming region 12 and to tunnel region 16. Accordingly, these devices require more extensive electrical isolation than other devices, such as read transistor 26 and logic transistors (not shown). Further, charge pumping circuitry (not shown) resides on the same substrate as EEPROM device 10, but is fabricated in locations remote from EEPROM device 10. For proper operation, programming region 12, sensing region 14, and tunnel region 16 must be electrically isolated from one another. Typically, regions 12, 14, and 16 are formed by doping the substrate with a conductivity-determining dopant. In the case where the active EEPROM devices are N-type devices, dopants such as arsenic, phosphorus, and the like are used to form regions 12, 14, and 16. Typically, these regions are formed in a P-type substrate.

Electrical isolation is necessary to prevent unwanted electrical current from flowing between the various active regions within the substrate. For example, trench isolation structures, generally depicted as element 34 in FIG. 1, are positioned between the active regions in order to electrically isolate each active region. Further, an electrical isolation 36 is provided around the periphery of EEPROM device 10 in order to electrically isolate the device from peripheral charge pumping circuitry. Those skilled in the art will appreciate that electrical isolation structures will reside in many regions of a semiconductor substrate to provide electrical isolation between adjacent active regions. As described above, the high voltage regions require more extensive electrical isolation than the low voltage regions. Accordingly, the present invention provides a structure and process for providing a varying degree of electrical isolation by varying the depth of a trench isolation structure formed in the substrate supporting EEPROM device 10.

Those skilled in the art will recognize that numerous variations are possible for the component arrangement in an EEPROM device. Accordingly, the particular arrangement illustrated in FIG. 1 is but one of many possible arrangements for an EEPROM device. Further, although the device and process of the invention will be described with respect to an N-type device, those skilled in the art will recognize that the conductivity of all regions can be reversed to provide a P-type device.

Figure 2:
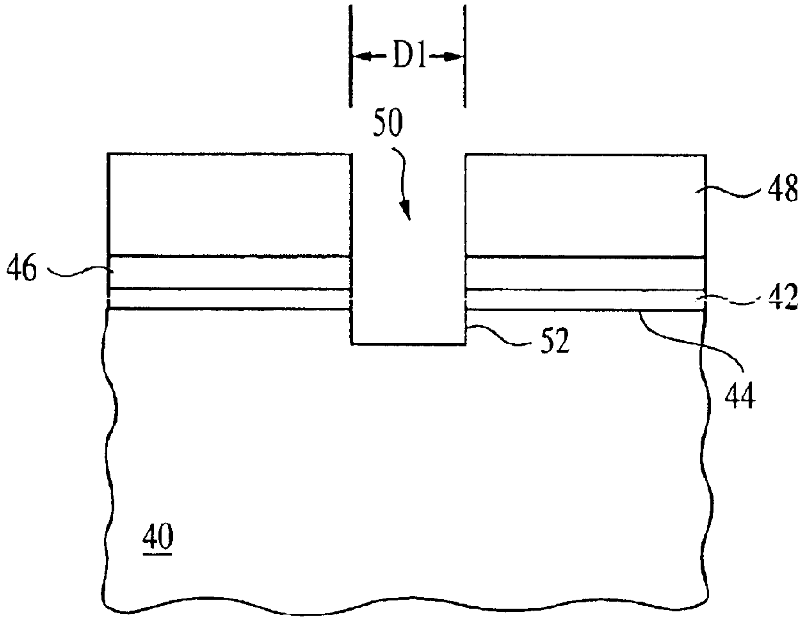
FIGS. 2–4 illustrate, in cross-section, processing steps for fabricating a trench structure in a substrate in accordance with one embodiment of the invention.

FIGS. 2–5 illustrate, in cross-section, a process for fabricating a trench structure in accordance with one embodiment of the invention. FIG. 2 illustrates a portion of a semiconductor substrate 40 having already undergone several processing steps in accordance with a first process embodiment. A pad oxide 42 overlies a principal surface 44 of substrate 40. A hard mask layer 46 overlies pad oxide layer 42. Hard mask layer 46 can be any of a number of materials that can resist thermal oxidation and offer etching resistance to a silicon etch. In a preferred embodiment, hard mask 46 is silicon nitride. A resist pattern 48 is formed to overlie hard mask 46. Resist pattern 48 includes an opening 50 having a lateral dimension D1. In accordance with the first embodiment of the invention, opening 50 has a lateral dimension substantially the same as the intended lateral dimension of the deep portion of the isolation trench.

Resist pattern 48 is a high voltage masking pattern that selectively defines regions of substrate 40 in which a deep trench is to be formed for the electrical isolation of high voltage transistors in substrate 40. In accordance with the invention, the lateral dimension D1 is constant across all regions of the substrate in which a deep trench is to be formed. Resist pattern 48 only exposes regions of substrate 40 where a high voltage isolation trench is to be formed. Regions that are to have a low voltage isolation trench are protected by resist pattern 48.

To begin the formation of a high voltage isolation trench in substrate 40, an etching process is carried out using resist pattern 48 as an etching mask. Preferably, substrate 40 is anisotropically etched, such that a recess 52 is formed in substrate 40. The etching process is carried out to form recess 52 in substrate 40 to a depth of about 500 angstroms to about 3000 angstroms. In accordance with a preferred embodiment of the invention, where substrate 40 is a silicon substrate, a reactive-ion-etch (RIE) process is carried out using chlorinated etching gases. Alternatively, other types of plasma etching techniques can be used, such as electron-cyclotron-resonance (ECR) etching, reactive sputter etching, and the like.

Figure 3:
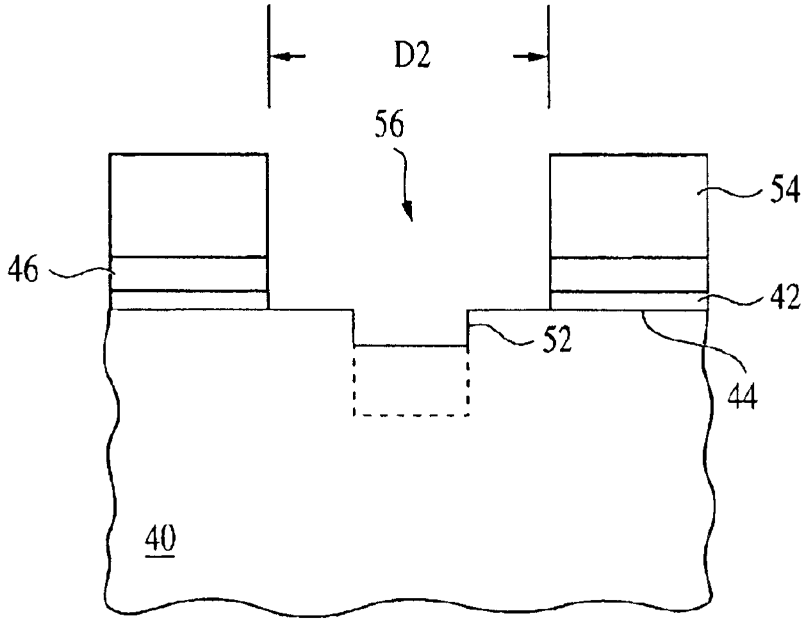

After forming recess 52, resist pattern 48 is removed and another resist pattern 54 is formed, as illustrated in FIG. 3. Resist pattern 54 includes an opening 56. As indicated by comparison between FIGS. 2 and 3, opening 56 has a lateral dimension that is greater than the corresponding lateral dimension of opening 50. Resist pattern 54 is an active area mask that is generally used to define the low voltage isolation regions for the active areas of substrate 40. Accordingly, resist pattern 54 is a general mask pattern that is used to pattern isolation structures for all low voltage active areas of substrate 40.

Figure 4:
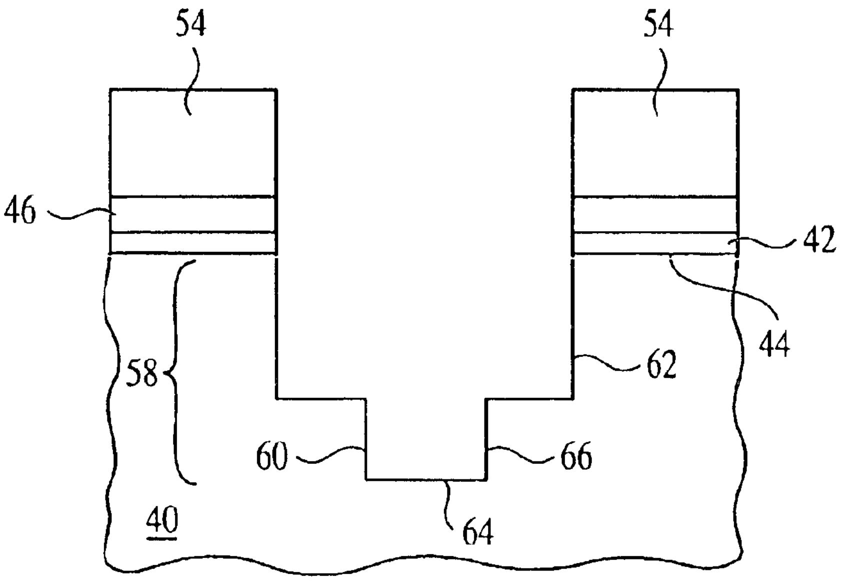

Once resist pattern 54 is in place, an etching process is carried out, as illustrated in FIGS. 3 and 4 to continue to form a trench structure in substrate 40. The etching process is carried out using resist pattern 54 as an etching mask, such that a high voltage isolation trench 58 is formed in substrate 40. As described above, since resist pattern 54 contains a low voltage isolation pattern, the pattern contains all low voltage trench structures as well as the high voltage trench structures. The etching process simultaneously forms the low voltage isolation trenches as well as a portion of the high voltage isolation trench structures. Initially, as illustrated in FIG. 3, the portions of pad oxide 42 and hard mask 46 exposed by opening 56 are etched away. Once the exposed portions of pad oxide 42 and hard mask 46 are removed, as illustrated in FIG. 4 the etching process continues to etch into principal surface 44 and to remove portions of substrate 40. During this etching process, recess 52 is made deeper in substrate 40.

Upon completion of the etch process, trench 58 includes a deep portion 60 and a shallow portion 62. Deep portion 60 includes a bottom surface 64 and a wall surface 66. Wall surface 66 is continuous in both deep portion 60 and shallow portion 62, and extends from bottom surface 64 to principal surface 44. In addition to providing a portion of the high voltage isolation trench structures, shallow portion 62 also forms the low voltage isolation trenches in low voltage regions of substrate 40 (not shown).

As shown by the dotted line in FIG. 3, during formation of high voltage isolation trench 58, the etching process continues to etch recess 52 into substrate 40, while simultaneously etching portions of principal surface 44 exposed by opening 56. Accordingly, the etching process sinks deep portion 60 further into substrate 40, while also forming shallow portion 62. In accordance with the preferred embodiment of the invention, the same etching process is used to form shallow portion 62 that was previously used to form recess 52. Upon completion of the etching process the bottom surface or ledge of shallow portion 62 preferably resides no more than about 3000 angstroms from principal surface 44, and bottom surface 64 of deep portion 60 preferably resides at least about 4000 angstroms from principal surface 44.

Although a specific preferred depth of deep portion 60 and shallow portion 62 is described, those skilled in the art will appreciate that high voltage isolation trench 58 can have regions formed to other depths. Further, although only two portions having different depths are illustrated, the trench can be fabricated to have several regions of differing depth in substrate 40. The specific depth, as well as the relative depth of the different portions of trench high voltage isolation 58, will depend upon several factors, such as the type of semiconductor device, the conductivity of the active elements, the junction depth of the active elements, and the like.

Figure 5:
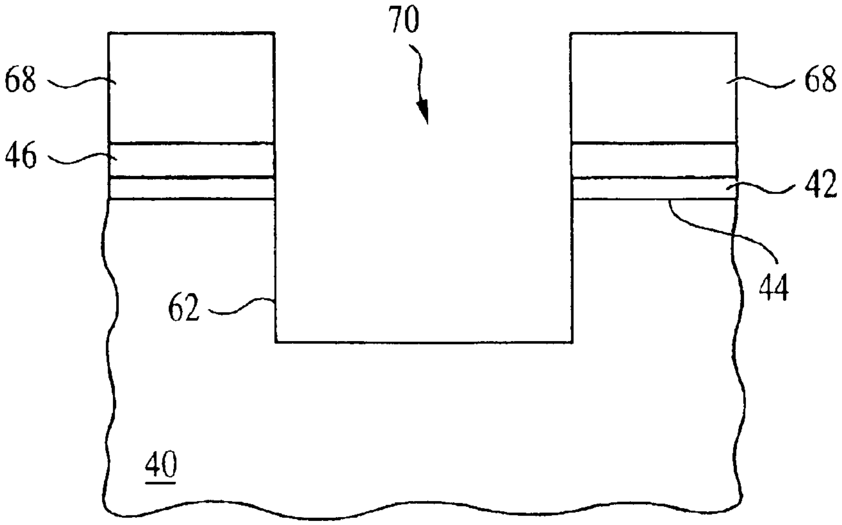
FIGS. 5–6 illustrate, in cross-section, processing steps for fabricating a trench structure in accordance with another embodiment of the invention.
Figure 6:
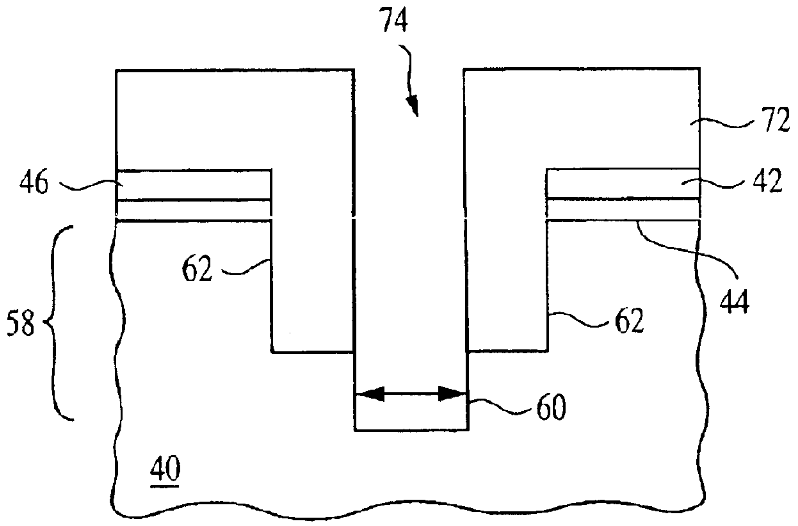

An alternative method for fabricating high voltage isolation trench 58 is illustrated in FIGS. 5–6. In accordance with the alternative embodiment, a resist pattern 68 is formed to overlie hard mask 46. Resist pattern 68 includes an opening 70 that will define the active trench isolation region for low-voltage devices fabricated in substrate 40. Accordingly, resist pattern 68 is substantially the same as resist pattern 54 illustrated in FIG. 3. In accordance with the alternative embodiment, a first etching process is carried out to form shallow portion 62 of trench 58. Then, as illustrated in FIG. 6, a resist pattern 72 is formed to overlie substrate 40. Resist pattern 72 includes an opening 74. Opening 74 defines the lateral dimension of deep portion 60 of trench 58.

Once resist pattern 72 is in place, a second etching process is carried out to form deep portion 60 in substrate 40. In similarity with the previous embodiment, opening 74 is substantially the same as the intended lateral dimension of deep portion 60. The lateral dimension is substantially the same across all regions of the substrate in which a deep trench is formed. Also, in accordance with a preferred embodiment, the first and second etching processes combine to create a shallow portion having a depth of no more than about 3000 angstroms and a deep portion having a depth of at least about 4000 angstroms. After completing the second etching process, resist pattern 72 is removed.

Figure 7:
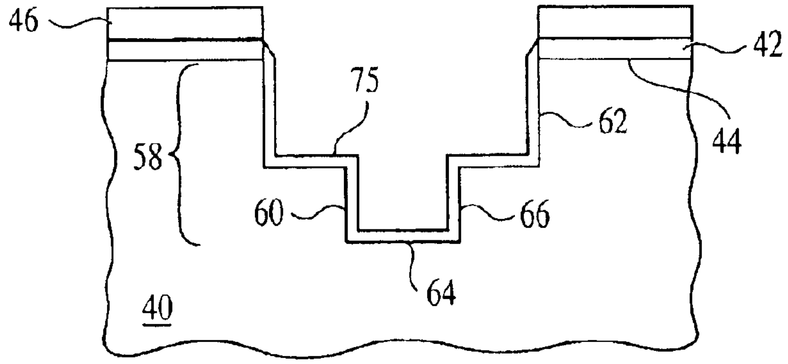
FIGS. 7–9 illustrate, in cross-section, further processing steps in accordance with the invention to complete the fabrication of a trench isolation structure.

Regardless of the particular etching sequence used, upon completion of the etching process a dielectric liner 75 is formed to overlie bottom surface 64 and wall surface 66 of high voltage isolation trench 58, as illustrated in FIG. 7. Preferably, dielectric liner 75 is formed by thermally oxidizing substrate 40 to form a silicon dioxide layer overlying the exposed surface of high voltage isolation trench 58. Hard mask 46 prevents the further oxidation of principal surface 44, such that the thickness of pad oxide layer 42 is not increased during the oxidation process. In an alternative embodiment, dielectric liner 75 can be formed by the deposition of a dielectric material, such as the chemical-vapor-deposition (CVD) of a dielectric material, such as silicon nitride, and the like.

Figure 8:
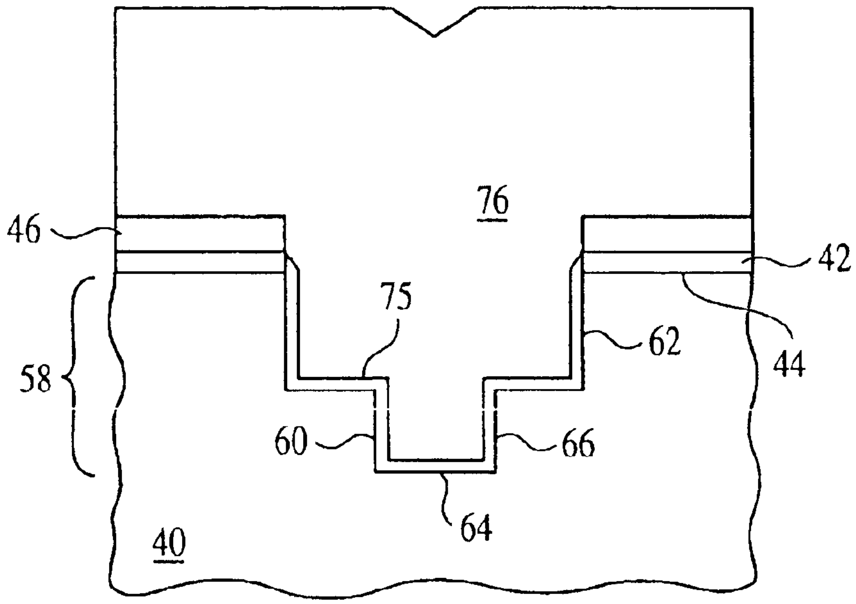

After forming dielectric liner 75, an insulating material 76 is deposited to fill high voltage isolation trench 58, as illustrated in FIG. 8. Insulating material 76 can be any of a number of electrically insulating materials, such as silicon dioxide, silicon nitride, a ceramic material, and the like. In a preferred embodiment, insulating material 76 is silicon dioxide formed by CVD using tetraethylorthosilane (TEOS) source gas. When using TEOS source gas, the CVD process can be carried out at a relatively low pressure, or alternatively at atmospheric pressure.

Figure 9:
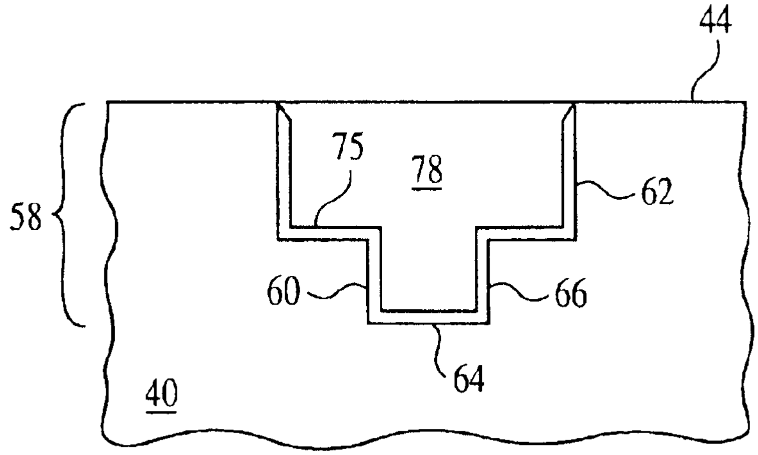

Referring to FIG. 9, once insulating material 76 is deposited, a planarization process is carried out to remove excess portions of insulating material 76 and hard mask 46. The planarization process forms an isolation region 78 in high voltage isolation trench 58. Preferably, the planarization process is carried out by a chemical-mechanical-polishing (CMP) process. The CMP process removes excess portions of insulating material 76 and forms a smooth surface that is continuous with principal surface 44. The CMP process also removes hard mask 46 and pad oxide 42.

In accordance with the invention, deep portion 60 is only formed in regions of substrate 40 that require electrical isolation between high voltage devices, or regions of substrate 40 containing high voltage devices. Accordingly, in regions of substrate 40 that are populated by low voltage devices, high voltage isolation trench 58 only includes shallow portion 62 and not deep portion 60. Those skilled in the art will appreciate that processing efficiency is obtained by the fabrication of an isolation trench having a varying depth using only two resist patterns. In particular, the low voltage and high voltage isolation trenches are formed with the addition of only one extra masking step. This is because the active isolation mask is used regardless of whether or not additional processing steps are provided for the electrical isolation of high voltage devices.

In a further aspect of the invention, the deep portion 60 of high voltage isolation trench 58 is fabricated to have substantially the same width in the high voltage regions of substrate 40. By maintaining substantially the same width at all locations in the device, an extra masking step during the planarization process is avoided. Those skilled in the art will appreciate that, in processes of the prior art, a separate mask was necessary to account for variations in the trench width in order to prevent the dishing phenomena during device CMP processing. In the process of the present invention, a reverse planarization mask is unnecessary since there are no wide trench areas that need to be protected to prevent dishing during the CMP process.

Thus, it is apparent that there has been described; in accordance with the invention, a device having electrically isolated low voltage regions and high voltage regions, and a process for fabricating the device, that fully provides the advantages set forth above. Although the invention has been described and illustrated with reference to specific illustrative embodiments thereof, it is not intended that the invention be limited to those embodiments. Those skilled in the art will recognize that variations and modifications can be made without departing from the spirit of the invention. For example, the order of certain steps in the described processes can be varied, such as forming the dielectric liner before forming the resist pattern and etching the substrate to form the deep portion of the high voltage isolation trench. Further, fabrication technology, such as x-ray resist and etching processes, deep-UV resist processes, molecular beam deposition processes, and the like, can be used. It is therefore intended to include within the invention all such variations and modifications as fall within the scope of the appended claims and equivalence thereof.

What is claimed is:

1. A process for fabricating a semiconductor device comprising:

providing a substrate having a principal surface and having a low voltage region and a high voltage region;

prior to any isolation trench etching steps, etching the substrate to simultaneously form a low voltage isolation trench in the low voltage region and a shallow portion of a high voltage isolation trench in the high voltage region; and forming a deep portion of the high voltage isolation trench in the high voltage region, wherein simultaneously forming a low voltage isolation trench in the low voltage region and a shallow portion of a high voltage isolation trench comprises etching the substrate to form the shallow portion, then etching the substrate to form the deep portion.

2. The process of claim 1, wherein the deep portion has a bottom surface, and wherein the shallow portion shares a continuous wall surface with the deep portion, the wall surface extending from the bottom surface to the principal surface.

3. The process of claim 2 further comprising forming a dielectric liner overlying the bottom surface and the wall surface.

4. The process of claim 3 further comprising depositing an insulating material in the high voltage isolation trench overlying the dielectric liner.

5. The process of claim 4, wherein depositing an insulating material comprises depositing a silicon dioxide from tetraethylorthosilane source gas.

6. The process of claim 1, wherein forming a deep portion of a high voltage isolation trench comprises:

forming a hard masking layer on the principal surface;

forming a resist mask pattern overlying the hard masking layer, wherein the resist mask pattern includes an opening having a lateral dimension substantially the same as the lateral dimension of the deep portion; and etching the substrate using the resist mask pattern as an etching mask.

7. The process of claim 1, wherein etching the substrate comprises etching a first lateral dimension of the substrate to begin forming the deep portion, then etching a second lateral dimension of the substrate to simultaneously form the shallow portion and to complete the deep portion, wherein the second lateral dimension is greater than the first lateral dimension.

8. A process for fabricating a semiconductor device comprising:

providing a substrate having a principal surface and having low voltage regions and high voltage regions;

prior to any isolation trench etching steps, etching the substrate to form low voltage trench structures and a shallow portion of high voltage trench structures in the substrate; and masking the shallow portion of the high voltage trench structures and etching the shallow portion of the high voltage trench structures to form a deep portion, wherein the deep portion has a bottom surface, wherein the shallow portion shares a continuous wall surface with the deep portion, the wall surface extending from the bottom surface to the principal surface, wherein the deep portion provides electrical isolation between the high voltage regions and the low voltage regions, and wherein the shallow portion of the high voltage trench structures provides electrical isolation between adjacent portions of the low voltage regions.

9. The process of claim 8, wherein masking the shallow portion of the high voltage trench structures and etching the shallow portion of the high voltage trench structures comprises:

forming a resist mask pattern overlying the substrate, wherein the resist mask pattern includes an opening having a lateral dimension;

etching the substrate using the resist mask pattern as an etching mask, wherein the deep portion has a lateral width substantially the same as the lateral dimension of the opening; and wherein the lateral width is substantially the same in all high voltage regions of the substrate.

10. A semiconductor device comprising:

a substrate having a principal surface and having a low voltage region and a high voltage region;

a memory device at the principal surface; and a trench in the high voltage region, the low voltage region, and surrounding a periphery of the memory device, the trench having in a simultaneously-formed deep portion and a shallow portion in a previously untrenched portion of the substrate;

wherein the deep portion provides electrical isolation between the high voltage region and the low voltage region, and wherein the shallow portion provides electrical isolation between adjacent portions of the low voltage region.

11. The device of claim 10, wherein the deep portion further comprises a bottom surface, and wherein the shallow portion shares a continuous wall surface with the deep portion, the wall surface extending from the bottom surface to the principal surface.

12. The device of claim 11 further comprising a dielectric liner overlying the bottom surface and the wall surface.

13. The device of claim 11, wherein the shallow portion further comprises a bottom surface, wherein the bottom surface of the shallow portion resides no more than about 3000 angstroms from the principal surface, and wherein the bottom surface of the deep portion resides at least about 4000 angstroms from the principal surface.

14. The device of claim 10, wherein the shallow portion has a first lateral dimension, wherein the deep portion has a second lateral dimension, and wherein the first lateral dimension is greater than the second lateral dimension.

15. The device of claim 14, wherein the deep portion further comprises a bottom surface, and wherein the deep portion comprises a channel region in the bottom surface.

16. The device of claim 10 further comprising an insulating material filling the trench.

17. A process for fabricating isolation trenches in a substrate of a semiconductor device comprising:

for each of a plurality of isolation trenches, forming in the same process step, prior to any trench forming steps, a shallow portion of sufficient depth to isolate a low voltage region, but not of sufficient depth to isolate a high voltage region; and for an isolation trench that is to isolate a high voltage region, forming within the shallow portion a deep portion of sufficient depth to isolate a high voltage region, wherein forming the deep portion is performed in a different process step than the process step for forming the shallow portion.

18. The process of claim 17, wherein forming the deep portion comprises forming a recess in regions of the substrate where the deep portion is to be formed before forming a shallow portion of the trench, the recess growing within the substrate to form the deep portion as the shallow portion is formed.

19. The process of claim 17, wherein forming the deep portion of a trench comprises forming the deep portion after forming a shallow portion of the trench, wherein the shallow portion is masked to prevent its further growth as the deep portion is formed.

* * * * *